United States Patent
Tsunetou

(10) Patent No.: US 7,369,449 B2
(45) Date of Patent: May 6, 2008

(54) SEMICONDUCTOR INTEGRATED CIRCUIT AND DATA OUTPUT METHOD

(75) Inventor: Kouji Tsunetou, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 172 days.

(21) Appl. No.: 11/433,353

(22) Filed: May 15, 2006

(65) Prior Publication Data

US 2007/0140021 A1   Jun. 21, 2007

(30) Foreign Application Priority Data

Dec. 21, 2005   (JP)   ............... 2005-368618

(51) Int. Cl.
*G11C 7/06*   (2006.01)
(52) U.S. Cl. .............. 365/189.07; 365/189.04
(58) Field of Classification Search .......... 365/189.07, 365/189.04, 190
See application file for complete search history.

(56) References Cited

U.S. PATENT DOCUMENTS 5,883,847 A * 3/1999 Takahashi ............... 365/208

7,110,305 B2 * 9/2006 Suwa et al. ............ 365/189.02

FOREIGN PATENT DOCUMENTS

JP   07-013743   1/1995
JP   2003-101415   4/2003

* cited by examiner

*Primary Examiner*—Anh Phung
(74) *Attorney, Agent, or Firm*—Staas & Halsey LLP

(57) ABSTRACT

A semiconductor integrated circuit for reducing power consumption and simultaneous switching noise in an output circuit, which outputs plural pieces of output data including first and second output data, each including a plurality of bits. The first output data is generated from first original data. The second output data is generated from second original data. A comparison circuit generates a determination signal indicating whether the number of changed bits of the second original data from the first original data is greater than a predetermined number. In accordance with the determination signal, a selection circuit generates output data expressing the second original data and the data type in a first expression format or output data expressing the complement data of the second original data and the data type in a second expression format. This is output as the second output data.

19 Claims, 3 Drawing Sheets

Fig.1 (Prior Art)

| Num | bit | | | | | | | |
|-----|---|---|---|---|---|---|---|---|
| | 7 | 6 | 5 | 4 | 3 | 2 | 1 | 0 |
| 0 | 0 | 0 | 0 | 0 | 0 | 0 | 0 | 0 |
| 1 | 0 | 0 | 0 | 0 | 0 | 0 | 0 | 1 |
| 2 | 0 | 0 | 0 | 0 | 0 | 0 | 1 | 0 |
| 3 | 0 | 0 | 0 | 0 | 0 | 0 | 1 | 1 |
| ⋮ | ⋮ | ⋮ | ⋮ | ⋮ | ⋮ | ⋮ | ⋮ | ⋮ |
| 252 | 1 | 1 | 1 | 1 | 1 | 1 | 0 | 0 |
| 253 | 1 | 1 | 1 | 1 | 1 | 1 | 0 | 1 |
| 254 | 1 | 1 | 1 | 1 | 1 | 1 | 1 | 0 |
| 255 | 1 | 1 | 1 | 1 | 1 | 1 | 1 | 1 |

Fig.3

| Num | 1st Expression | | | | | | | | | 2nd Expression | | | | | | | | |
|-----|---|---|---|---|---|---|---|---|---|---|---|---|---|---|---|---|---|---|
| | A | 7 | 6 | 5 | 4 | 3 | 2 | 1 | 0 | A | 7 | 6 | 5 | 4 | 3 | 2 | 1 | 0 |
| 0 | 0 | 0 | 0 | 0 | 0 | 0 | 0 | 0 | 0 | 1 | 1 | 1 | 1 | 1 | 1 | 1 | 1 | 1 |
| 1 | 0 | 0 | 0 | 0 | 0 | 0 | 0 | 0 | 1 | 1 | 1 | 1 | 1 | 1 | 1 | 1 | 1 | 0 |
| 2 | 0 | 0 | 0 | 0 | 0 | 0 | 0 | 1 | 0 | 1 | 1 | 1 | 1 | 1 | 1 | 1 | 0 | 1 |
| 3 | 0 | 0 | 0 | 0 | 0 | 0 | 0 | 1 | 1 | 1 | 1 | 1 | 1 | 1 | 1 | 1 | 0 | 0 |
| ⋮ | | ⋮ | ⋮ | ⋮ | ⋮ | ⋮ | ⋮ | ⋮ | ⋮ | | ⋮ | ⋮ | ⋮ | ⋮ | ⋮ | ⋮ | ⋮ | ⋮ |
| 252 | 0 | 1 | 1 | 1 | 1 | 1 | 1 | 0 | 0 | 1 | 0 | 0 | 0 | 0 | 0 | 0 | 1 | 1 |
| 253 | 0 | 1 | 1 | 1 | 1 | 1 | 1 | 0 | 1 | 1 | 0 | 0 | 0 | 0 | 0 | 0 | 1 | 0 |
| 254 | 0 | 1 | 1 | 1 | 1 | 1 | 1 | 1 | 0 | 1 | 0 | 0 | 0 | 0 | 0 | 0 | 0 | 1 |
| 255 | 0 | 1 | 1 | 1 | 1 | 1 | 1 | 1 | 1 | 1 | 0 | 0 | 0 | 0 | 0 | 0 | 0 | 0 |

SEMICONDUCTOR INTEGRATED CIRCUIT AND DATA OUTPUT METHOD

CROSS-REFERENCE TO RELATED APPLICATIONS

This application is based upon and claims the benefit of priority from the prior Japanese Patent Application No. 2005-368618, filed on Dec. 21, 2005, the entire contents of which are incorporated herein by reference.

BACKGROUND OF THE INVENTION

The present invention relates to a semiconductor integrated circuit, and more specifically, to a data output method for reducing power consumption and for reducing simultaneous switching noise in a semiconductor output circuit.

Portable electronic gadgets have become popular over the years. Reduction in power consumption of semiconductor integrated circuits (hereinafter referred to LSIs) is an important issue in terms of addressing global environment problems. Although progress in semiconductor processing technology has lowered operation voltages, resistance to noise has also become lower. This may result in noise affecting an LSI such that the LSI does not function properly or the LSI not functioning in accordance with its specification. Accordingly, it has become more important to perform designing that takes noise into account.

An LSI includes an input/output circuit (hereinafter referred to as I/O) that functions as an interface between the LSI and an external device. The I/O includes a signal circuit and a power supply circuit. The signal circuit includes an output circuit for providing a signal to the external device, an input circuit for receiving the signal from the external device, and a bidirectional circuit for outputting and inputting the signal. The power supply circuit includes a power supply circuit for supplying high potential power supply voltage (VDD) and a power supply circuit for supplying low potential power supply voltage (GND). The I/O, which is generally configured by a CMOS, inputs and outputs a signal when the CMOS is turned ON and OFF.

The power supply circuit is required to supply the LSI with constant voltage. However, in reality, constant voltage is not always obtained due to the influence of electrical parasitic elements in power supply wiring. The power supply wiring includes the electrical parasitic elements of resistance, capacitance, and inductance. Thus, when ON and OFF states are simultaneously switched in a plurality of output circuits including the bidirectional circuit, the value of the current flowing through the power supply wiring greatly changes within a short period of time due to the influence of the electrical parasitic element. This fluctuates the power supply voltage. Such type of noise is generally referred to as simultaneous switching noise (SSN) or a simultaneous switching output (SSO) noise.

The simultaneous switching noise affects the waveform and delay of the output signal. This may cause an anomaly in the LSI or lowering of the operating speed. Over recent years especially, the higher speed and function of an LSI has resulted in an increase in the amount and speed of data transfer. Thus, the influence of simultaneous switching noise is no longer negligible. Accordingly, it has become more important to perform designing that takes simultaneous switching noise into account.

Various designing methods for reducing simultaneous switching noise have been proposed in the prior art. One method increases the number of power supplies (i.e., number of power supply circuits) so as to increase noise resistance. Another method improves the mounting technique so that the inductance (e.g., inductance of bonding wire or lead frame), which produces noise, becomes small. A further method adds a capacitor on a board to suppress noise. Such designs for reducing noise is normally performed assuming the worst case in which the influence of the noise becomes the greatest.

As shown in FIG. 1, for example, when designing the LSI that performs the data transfer of eight bits, a case in which the bit pattern changes from "00000000", representing the decimal number of "0", to "11111111", representing the decimal number of "255", is assumed. That is, a case in which the CMOS of each output circuit corresponding to the bits are all simultaneously switched such that every one of the bit values are inverted must be assumed. By assuming the worst case in such a manner, the operation reliability of the LSI with respect to simultaneous switching noise is ensured.

When performing designing that assumes the worst case, the quantity of necessary components for countering noise (e.g., number of power supplies on the chip and number of capacitors on the board etc.) is required to be in accordance with the amount of simultaneous switches that must be considered. This increases the number of components. Further, when the amount of simultaneous switches increases, a large amount of noise margins must be accordingly provided. This not only restricts the data transfer speed and inhibits increase in speed of the LSI, but also makes designing difficult. The bit value described above is expressed by ON/OFF of the CMOS. Thus, when the number of simultaneous switches (number of simultaneous change of bits) increases and the CMOSs are frequently switched between ON and OFF states, the power consumption increases. It is thus desirable that the number of simultaneous switches be minimized.

Japanese Laid-Open Patent Publication No. 2003-101415 and Japanese Laid-Open Patent Publication No. 7-13743 describe a coding method that minimizes simultaneous switches in an LSI, which handles signals in which bit changes frequently occur near 0 (i.e., signal in which the transition possibility of the bits is expressed by a normal distribution). Such signals may be for voice data of PCM (Pulse Code Modulation) or color component data of MPEG (Moving Picture Experts Group).

SUMMARY OF THE INVENTION

A phenomenon in which all the bits simultaneously change (worst case) rarely occurs in reality during data transfer. However, when performing designing taking into account simultaneous switching noise, the worst case must be assumed even if the transition possibility of the bits may be expressed by a normal distribution. Thus, even though such a phenomenon is not likely to occur in reality, the components for suppressing noise is required in the quantity corresponding to the worst case. Further, in the configuration described in the above publications, the power consumption and the simultaneous switching noise are not reduced for signals of which transition probability of bits is not necessarily in a normal distribution (signal in which bit change is not limited to the proximity of 0 but occurs randomly). This essentially does not solve the above problem.

The present invention provides a semiconductor integrated circuit and data output method for reducing power consumption and simultaneous switching noise.

One aspect of the present invention is a semiconductor integrated circuit including an output circuit for sequentially outputting plural pieces of output data including first output data and second output data, which follows the first output data. Each of the plural pieces of the output data includes a plurality of bits. The first output data is generated from first original data, and the second output data is generated from second original data. A comparison circuit compares the first original data and the second original data to generate a determination signal indicating whether or not the number of changed bits of the second original data from the first original data is greater than a predetermined number of bits. A complement generation circuit generates complement data related to the second original data. A selection circuit, connected to the comparison circuit, the complement generation circuit, and the output circuit, selects, in accordance with the determination signal, either one of data including the second original data in a first expression format or data including the complement data in a second expression format and provides the output circuit with the selected data as the second output data.

A further aspect of the present invention is a semiconductor integrated circuit including an output circuit for sequentially outputting plural pieces of output data including first output data and second output data, which follows the first output data. Each of the plural pieces of output data includes a plurality of bits. The first output data is generated from first original data, and the second output data is generated from second original data. A comparison circuit compares the first original data and the second original data to generate a determination signal indicating whether or not the number of changed bits of the second original data from the first original data is greater than a predetermined number of bits. A complement generation circuit generates complement data related to the second original data. A selection circuit, connected to the comparison circuit, the complement generation circuit, and the output circuit, selects, in accordance with the determination signal, either one of data including the second original data in a first expression format or data including the complement data in a second expression format and provides the output circuit with the selected data as the second output data. An input circuit receives input data expressed in either the first expression format or the second expression format. A determination circuit, connected to the input circuit, determines whether the input data is expressed in the first expression format or the second expression format and generates original data contained in the input data based on the determination.

Another aspect of the present invention is a method for sequentially outputting from an output circuit plural pieces of output data including first output data and second output data, which follows the first output data. Each of the plural pieces of the output data includes a plurality of bits. The first output data is generated from first original data, and the second output data is generated from second original data. The method includes comparing the first original data and the second original data to determine whether or not the number of changed bits of the second original data from the first original data is greater than a predetermined number of bits, generating complement data related to the second original data, selectively generating, in accordance with the number of changed bits, data including the second original data in a first expression format and data including the complement data in a second expression format, and providing the output circuit with the generated data in the first expression format or the second expression format as the second output data.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which:

FIG. 1 is a chart showing bit patterns of data that is transferred in the prior art;

FIG. 3 is a chart showing bit patterns of data transferred between the semiconductor integrated circuit and a memory of FIG. 2.

DETAILED DESCRIPTION OF THE PREFERRED EMBODIMENTS

Figure 2:
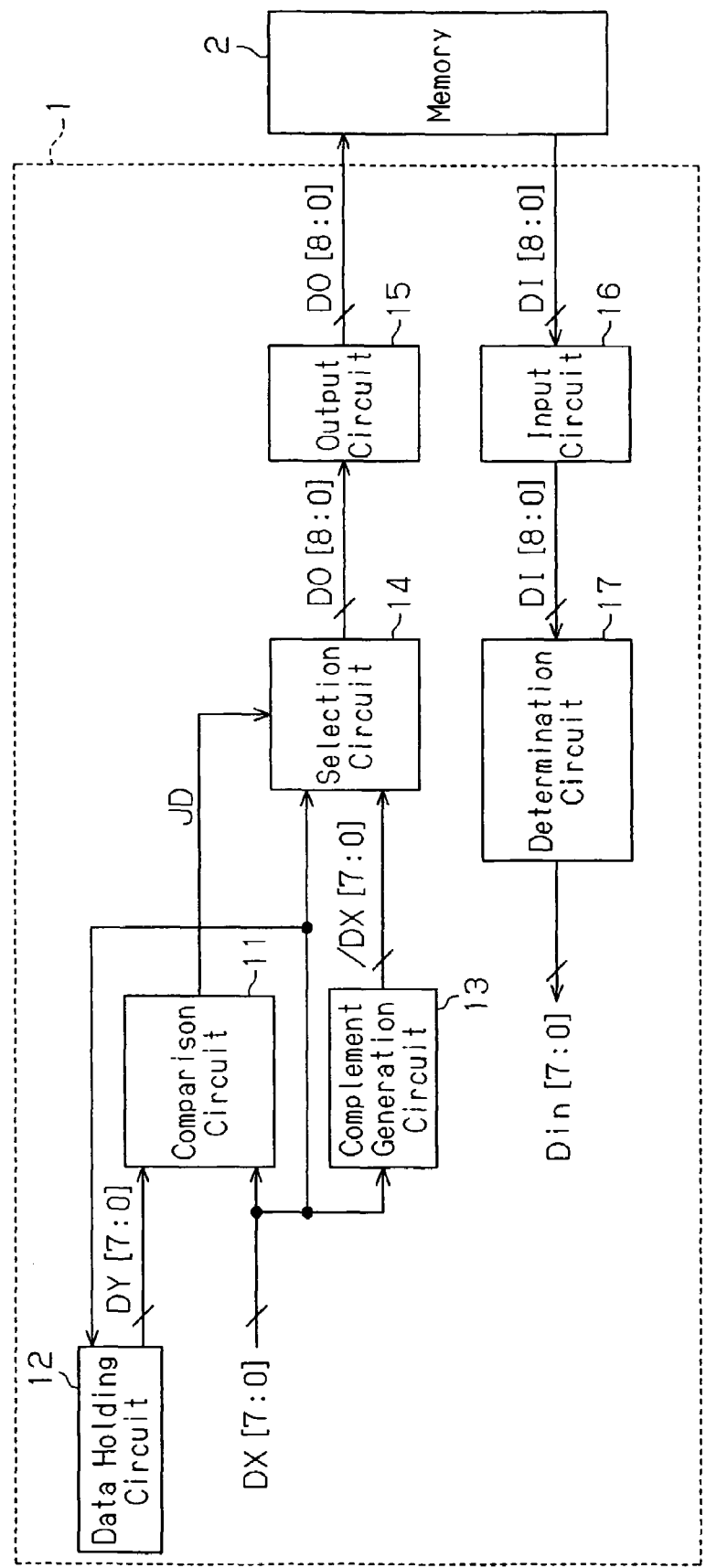
FIG. 2 is a schematic block diagram of a semiconductor integrated circuit according to a preferred embodiment of the present invention.

A semiconductor integrated circuit 1 according to a preferred embodiment of the present invention will now be described with reference to the drawings.

FIG. 2 is a schematic block diagram of the semiconductor integrated circuit 1. The semiconductor integrated circuit 1 is connected to a memory 2. Data is transferred between the semiconductor integrated circuit 1 and the memory 2. The semiconductor integrated circuit 1 includes a comparison circuit 11, a data holding circuit 12, a complement generation circuit 13, a selection circuit 14, and an output circuit 15, which are arranged along a data output path. The semiconductor integrated circuit 1 further includes an input circuit 16 and a determination circuit 17, which are arranged along a data input path.

First, the data output path will be discussed.

The comparison circuit 11 is provided with original data DY (hereinafter referred to as first original data) of output data (hereinafter referred to as first output data), finally output from the output circuit 15. The comparison circuit 11 is further provided with original data DX (hereinafter referred to as second original data) of output data (hereinafter referred to as second output data), output from the output circuit 15 following the first output data. The first original data DY is provided from the data holding circuit 12. The original data is a signal in which the bit pattern randomly changes and includes write data. The original data (first original data DY, second original data DX) is configured by eight bits in the preferred embodiment.

The comparison circuit 11 compares the first original data DY and the second original data DX to generate a determination signal JD indicating whether or not the number of changed bits of the second original data DX from the first original data DY is greater than a predetermined number of bits. When the original data has eight bits, the predetermined number of bits is set to four bits. In this case, the comparison circuit 11 generates the determination signal JD indicating whether or not the number of changed bits is greater than four bits.

The complement generation circuit 13 inverts each bit value of the second original data DX to generate complement data /DX (/ representing inversion), which indicates the inverted data, and provides the complement data /DX to the selection circuit 14. When the second original data DX is "00000000", the complement generation circuit 13 generates "11111111" as the complement data /DX.

The selection circuit 14 selects either the second original data DX or the complement data /DX in accordance with the determination signal JD from the comparison circuit 11. Then, the selection circuit 14 adds determination data A, which indicates the type of the selected data, to the selected data. This generates output data DO having nine bits and expressed either in a first expression format or a second expression format. The determination data A is configured by one or more bits. The determination data is configured by one bit in the preferred embodiment.

More specifically, when the received determination signal JD indicates that the number of changed bits is greater than or equal to five bits, the selection circuit 14 selects the complement data /DX. Then, the selection circuit 14 adds determination data A having a bit value of "1" to the complement data /DX and generates the output data DO in the second expression format.

For instance, when the first original data DY is "00000000" and the second original data DX is "11111111", the number of changed bits of the second original data DX from the first original data DY is eight. Therefore, the selection circuit 14 selects the complement data /DX of "00000000". The selection circuit 14 then adds the determination data A having a bit value of "1" to the complement data /DX and generates the output data DO of "100000000".

When the received determination signal JD indicates that the number of changed bits is less than or equal to four bits, the selection circuit 14 selects the second original data DX. Then, the selection circuit 14 adds the determination data A having a bit value of "0" to the second original data DX and generates the output data DO in the first expression format.

For instance, when the first original data DY is "00000000" and the second original data DX is "00000001", the number of changed bits of the second original data DX from the first original data DY is one. Therefore, the selection circuit 14 selects the second original data DX of "00000001". The selection circuit 14 then adds the determination data A having a bit value of "0" to the second original data DX and generates the output data DO of "000000001".

The output circuit 15 sequentially outputs plural pieces of output data including the first output data and the second output data, which follows the first output data. The output circuit 15 outputs the output data DO (data in first expression format or data in second expression format) from the selection circuit 14 to the memory 2 as the second output data. The output circuit 15 includes CMOSs, the quantity of which corresponds to the data width (nine bits in the present embodiment) of the output data DO. Accordingly, each bit value of the output data DO is expressed by the ON and OFF states of the corresponding CMOS.

The data input path will now be discussed.

Input data DI, such as read data, read from the memory 2 is provided to the input circuit 16. The input data DI is expressed in the expression format of either the first expression format or the second expression format. More specifically, the input data DI has nine bits including the eight bits of the original data and one bit of the determination data A. In the same manner as the output circuit 15, the input circuit 16 includes CMOSs, the quantity of which corresponds to the data width (nine bits in the present embodiment) of the input data DI.

The determination circuit 17 reads the determination data A, which is added at the head of the input data DI provided from the input circuit 16, and determines whether the bit value of the determination data A is "1" or "0". The determination circuit 17 determines that the input data DI is in the first expression format when the bit value is "0". In this case, the determination circuit 17 provides an internal circuit (not shown) with the eight bits of data following the determination data A ("0") as the input data Din.

The determination circuit 17 determines that the input data DI is in the second expression format when the bit value of the determination data A is "1". In this case, the determination circuit inverts each bit value of the eight bits following the determination data A ("1") and provides the internal circuit (not shown) with the inverted data as the input data Din. In this manner, the determination circuit 17 restores the input data DI of nine bits to the original data of eight bits.

The operation of the semiconductor integrated circuit 1 will now be discussed.

FIG. 3 is a chart showing the bit patterns of the data transferred between the semiconductor integrated circuit 1 and the memory 2 of FIG. 2. More specifically, FIG. 3 shows the bit patterns of the output data DO (nine bits). In the chart, the original data (eight bits) expressed in the binary numbers of "00000000" through "11111111" is shown in association with the corresponding numerical values in the decimal forms of "0" through "255".

In the preferred embodiment, when the original data corresponding to a certain numerical value is output from the semiconductor integrated circuit 1 to the memory 2, the output data DO is expressed in either the first expression format or the second expression format when output from the output circuit 15. In accordance with the determination signal JD, the selection circuit 14 selects the expression format for the output data from the two types of expression formats so as to reduce the amount of simultaneous switches (number of simultaneous bit changes) in the output circuit 15. The selection circuit 14 selects the second expression format using the complement data /DX when the number of changed bits of the second original data DX from the first original data DY is greater than or equal to five bits. Further, the selection circuit 14 selects the first expression format using the second original data DX when the number of changed bits is less than or equal to four bits. As a result, the output circuit 15 outputs the output data DO selected by the selection circuit 14.

In this output method, the amount of simultaneous switches in the output circuit 15 is minimized regardless of the transition possibility of the bits. Specifically, the amount of simultaneous switches in the nine CMOSs in the output circuit 15 is limited to a maximum of five switches (worst case) in the present embodiment. That is, the number of simultaneous bit changes is limited to a maximum of five bits in the nine bits of output data DO, which includes one bit of the determination data A. This is the same for the input circuit 16.

Therefore, the occurrence of simultaneous switching noise in the output circuit 15 and the input circuit 16 is suppressed. Further, power consumption is lowered since repetitively switching of the CMOSs between ON and OFF states is suppressed. For the transfer of eight bits of data, the amount of signal transition is reduced by about 18% by employing the present method (the maximum number of simultaneous switches being five) in comparison with the prior art method (maximum number of simultaneous switches being eight). This greatly reduces power consumption. Further, since the number of simultaneous switches in the worst case is reduced to five with the present method, the quantity of components for suppressing noise (e.g., quantity of power supply circuits on a chip and quantity of capacitors on a board) is reduced in comparison with the prior art. This facilitates the designing of an LSI and lowers costs.

The semiconductor integrated circuit 1 of the present embodiment has the advantages described below.

(1) In accordance with the number of changed bits of the second original data DX from the first original data DY, the selection circuit 14 selects the output data DO in the expression format that reduces more simultaneous switches in the output circuit 15. The selection circuit 14 selects either the first expression format using the second original data DX or the second expression format using the complement data /DX. The output circuit 15 outputs the output data DO selected in the selection circuit 14. Therefore, the number of simultaneous switches in the output circuit 15 is limited to a minimum number regardless of the transition possibility of the bits. That is, the number of simultaneous switches is limited to a maximum of five bits in the nine bits of output data DO, which includes one bit of the determination data A. This reduces simultaneous switching noise.

(2) The reduction of simultaneous switching noise avoids conditions in which the data transfer speed must be restricted to speed increase is hindered. Further, complicated designing is avoided in an optimal manner.

(3) The number of simultaneous switches in the output circuit 15 is limited to a maximum of five (for the output data DO of nine bits including the determination data A of one bit). This enables reduction in power consumption of the output circuit 15.

(4) The number of simultaneous switches in the worst case is limited to a maximum of five (for the output data DO of nine bits including the determination data A of one bit). This reduces the number of components for suppressing noise.

(5) The input circuit receives the input data D1 in either the first expression format or the second expression format from the memory 2. As a result, the number of simultaneous switches in the input circuit 16 is limited to a minimum number in the same manner as in the output circuit 15.

It should be apparent to those skilled in the art that the present invention may be embodied in many other specific forms without departing from the spirit or scope of the invention. Particularly, it should be understood that the present invention may be embodied in the following forms.

The semiconductor integrated circuit 1 is not limited to a circuit that performs data transfer with the memory 2.

The original data (DX, DY) is not limited to eight bits. The original data may be four bits or sixteen bits.

The determination data A is preferably configured by one bit since it is only required that the type of data be determined. However, the determination data A is not necessarily limited to one bit.

The complement data /DX is not necessarily limited to the inverted data of the second original data DX and may be data expressed by other complement expression formats.

The memory 2 may include a means for converting the output data DO to the original data (mechanism for retrieving the original data from the output data DO in accordance with the determination data A). In this case, the input circuit 16 receives eight bits data from the memory 2 and provides the data as input data Din to the internal circuit (not shown). Accordingly, the determination circuit 17 is not essential in the semiconductor integrated circuit 1.

The output circuit 15 may include the function of the input circuit 16. That is, the output circuit 15 may be replaced by a bidirectional circuit having the functions of the output circuit 15 and the input circuit 16. In this case, the input circuit 16 may be omitted, and the determination circuit 17 is connected to the bidirectional circuit.

The determination circuit 17 may determine only the expression format of the input data DI, and the process for generating the original data (input data Di) based on the determination result may be performed by a separate circuit.

The present examples and embodiments are to be considered as illustrative and not restrictive, and the invention is not to be limited to the details given herein, but may be modified within the scope and equivalence of the appended claims.

What is claimed is:

1. A semiconductor integrated circuit comprising:
   an output circuit for sequentially outputting plural pieces of output data including first output data and second output data, which follows the first output data, with each of the plural pieces of the output data including a plurality of bits, wherein the first output data is generated from first original data, and the second output data is generated from second original data;
   a comparison circuit for comparing the first original data and the second original data to generate a determination signal indicating whether or not the number of changed bits of the second original data from the first original data is greater than a predetermined number of bits;
   a complement generation circuit for generating complement data related to the second original data; and
   a selection circuit, connected to the comparison circuit, the complement generation circuit, and the output circuit, for selecting, in accordance with the determination signal, either one of data including the second original data in a first expression format or data including the complement data in a second expression format and providing the output circuit with the selected data as the second output data.

2. The semiconductor integrated circuit according to claim 1, wherein the complement generation circuit inverts the value of each bit in the second original data to generate the complement data.

3. The semiconductor integrated circuit according to claim 1, wherein the selection circuit selects either one of the second original data or the complement data in accordance with the determination signal and adds to the selected data determination data indicating a type for the selected data to generate either one of the data in the first expression format or the data in the second expression format.

4. The semiconductor integrated circuit according to claim 3, further comprising:
   an input circuit for receiving input data expressed in the first expression format or the second expression format; and
   a determination circuit, connected to the input circuit, for determining from the determination data whether the input data is expressed in the first expression format or the second expression format.

5. The semiconductor integrated circuit according to claim 4, wherein the determination circuit generates the original data contained in the input data based on the determination of the expression format of the input data with the determination data.

6. The semiconductor integrated circuit according to claim 5, further comprising:
   a data holding circuit, connected to the comparison circuit, for holding the first original data.

7. The semiconductor integrated circuit according to claim 6, wherein the selection circuit generates the data in the second expression format when the number of changed bits is greater than the predetermined number of bits, and the selection circuit generates the data in the first expression format when the number of changed bits is less than or equal to the predetermined number of bits.

8. A semiconductor integrated circuit comprising:
- an output circuit for sequentially outputting plural pieces of output data including first output data and second output data, which follows the first output data, with each of the plural pieces of output data including a plurality of bits, wherein the first output data is generated from first original data, and the second output data is generated from second original data;
- a comparison circuit for comparing the first original data and the second original data to generate a determination signal indicating whether or not the number of changed bits of the second original data from the first original data is greater than a predetermined number of bits;
- a complement generation circuit for generating complement data related to the second original data;
- a selection circuit, connected to the comparison circuit, the complement generation circuit, and the output circuit, for selecting, in accordance with the determination signal, either one of data including the second original data in a first expression format or data including the complement data in a second expression format and providing the output circuit with the selected data as the second output data;
- an input circuit for receiving input data expressed in either the first expression format or the second expression format; and
- a determination circuit, connected to the input circuit, for determining whether the input data is expressed in the first expression format or the second expression format and generating original data contained in the input data based on the determination.

9. The semiconductor integrated circuit according to claim 8, wherein the complement generation circuit inverts the value of each bit in the second original data to generate the complement data.

10. The semiconductor integrated circuit according to claim 8, wherein the selection circuit selects either one of the second original data or the complement data in accordance with the determination signal and adds to the selected data determination data indicating a type for the selected data to generate either one of the data in the first expression format or the data in the second expression format.

11. The semiconductor integrated circuit according to claim 10, wherein the determination circuit determines the expression format of the input data in accordance with the determination data contained in the input data.

12. The semiconductor integrated circuit according to claim 11, further comprising a data holding circuit, connected to the comparison circuit, for holding the first original data.

13. The semiconductor integrated circuit according to claim 12, wherein the selection circuit generates the data in the second expression format when the number of changed bits is greater than the predetermined number of bits, and the selection circuit generates the data in the first expression format when the number of changed bits is less than or equal to the predetermined number of bits.

14. A method for sequentially outputting from an output circuit plural pieces of output data including first output data and second output data, which follows the first output data, with each of the plural pieces of the output data including a plurality of bits, wherein the first output data is generated from first original data, and the second output data is generated from second original data, the method comprising:
- comparing the first original data and the second original data to determine whether or not the number of changed bits of the second original data from the first original data is greater than a predetermined number of bits;
- generating complement data related to the second original data;
- selectively generating, in accordance with the number of changed bits, data including the second original data in a first expression format and data including the complement data in a second expression format; and
- providing the output circuit with the generated data in the first expression format or the second expression format as the second output data.

15. The method according to claim 14, wherein said generating complement data includes inverting the value of each bit in the second original data to generate the complement data.

16. The method according to claim 14, wherein said selectively generating includes selecting either one of the second original data or the complement data in accordance with the determination signal, and adding to the selected data determination data indicating a type for the selected data.

17. The method according to claim 16, further comprising:
- receiving input data expressing in either the first expression format or the second expression format; and
- determining from the determination data whether the input data is expressed in the first expression format or the second expression format.

18. The method according to claim 17, further comprising:
- holding the first original data.

19. The method according to claim 18, wherein said selectively generating includes generating the data in the second expression format when the number of changed bits is greater than the predetermined number of bits, and generating the data in the first expression format when the number of changed bits is less than or equal to the predetermined number of bits.

* * * * *